United States Patent
Kolics et al.

(10) Patent No.: US 9,768,063 B1
(45) Date of Patent: Sep. 19, 2017

(54) DUAL DAMASCENE FILL

(71) Applicant: Lam Research Corporation, Fremont, CA (US)

(72) Inventors: Artur Kolics, Dublin, CA (US); Praveen Nalla, Fremont, CA (US); Lie Zhao, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/199,632

(22) Filed: Jun. 30, 2016

(51) Int. Cl.
*H01L 21/768* (2006.01)

(52) U.S. Cl.
CPC .. *H01L 21/76883* (2013.01); *H01L 21/76814* (2013.01); *H01L 21/76843* (2013.01); *H01L 21/76879* (2013.01)

(58) Field of Classification Search
USPC .......................................................... 438/637
See application file for complete search history.

(56) References Cited

U.S. PATENT DOCUMENTS

| | | | |
|---|---|---|---|
| 4,567,066 A | 1/1986 | Schultz et al. | |
| 4,840,820 A | 6/1989 | Schultz et al. | |
| 6,365,502 B1 | 4/2002 | Paranjpe et al. | |
| 7,049,234 B2 | 5/2006 | Cheng et al. | |
| 7,268,074 B2 | 9/2007 | Yakobson et al. | |
| 7,273,814 B2 | 9/2007 | Matsuda | |
| 7,476,618 B2 | 1/2009 | Kilpela et al. | |
| 8,258,057 B2 | 9/2012 | Kuhn et al. | |
| 8,771,804 B2 | 7/2014 | Dordi et al. | |
| 8,916,232 B2 | 12/2014 | Yoon et al. | |
| 9,236,292 B2 | 1/2016 | Romero et al. | |
| 2002/0074664 A1 | 6/2002 | Nogami et al. | |
| 2003/0092261 A1* | 5/2003 | Kondo | B24B 37/005 438/638 |
| 2006/0121733 A1* | 6/2006 | Kilpela | C23C 16/18 438/681 |
| 2006/0188659 A1 | 8/2006 | Chen et al. | |
| 2006/0252252 A1* | 11/2006 | Zhu | B82Y 30/00 438/618 |
| 2006/0280860 A1 | 12/2006 | Paneccasio, Jr. et al. | |
| 2014/0183739 A1 | 7/2014 | Li et al. | |
| 2015/0159277 A1 | 6/2015 | Wojcik et al. | |
| 2016/0163587 A1* | 6/2016 | Backes | H01L 21/76849 257/751 |

* cited by examiner

*Primary Examiner* — Zandra Smith
*Assistant Examiner* — Lawrence Tynes, Jr.
(74) *Attorney, Agent, or Firm* — Beyer Law Group LLP

(57) ABSTRACT

A method for filling vias formed in a dielectric layer with a metal or metal alloy that has a low solubility with copper over copper containing interconnects, wherein the vias are part of a dual damascene structure with trenches and vias is provided. A sealing layer of a first metal or metal alloy that has a low solubility with copper is selectively deposited directly on the copper containing interconnects in at bottoms of the vias, wherein sidewalls of the dielectric layer forming the vias are exposed to the depositing the sealing layer, and wherein the first metal or metal alloy that has a low solubility is selectively deposited to only form a layer on the copper containing interconnects. A via fill of a second metal or metal alloy that has a low solubility with copper is electrolessly deposited over the sealing layer, which fills the vias.

20 Claims, 4 Drawing Sheets

US 9,768,063 B1

DUAL DAMASCENE FILL

BACKGROUND OF THE INVENTION

Field of the Invention

The invention relates to a method of forming semiconductor devices on a semiconductor wafer. More specifically, the invention relates to forming metal features with vias and trenches.

In forming semiconductor devices, conductive metal features are formed in dielectric layers over metal interconnects. The conductive metal contacts may be formed by dual damascene features of vias and trenches.

SUMMARY OF THE INVENTION

To achieve the foregoing and in accordance with the purpose of the present disclosure, a method for filling vias formed in a dielectric layer with a metal or metal alloy that has a low solubility with copper over copper containing interconnects, wherein the vias are part of a dual damascene structure with trenches and vias, is provided. A sealing layer of a first metal or metal alloy that has a low solubility with copper is selectively deposited directly on the copper containing interconnects at bottoms of the vias, wherein sidewalls of the dielectric layer forming the vias are exposed to the depositing first metal or metal alloy, and wherein the first metal or metal alloy that has a low solubility is selectively deposited to only form a sealing layer on the copper containing interconnects. A via fill of a second metal or metal alloy that has a low solubility with copper is electrolessly deposited over the sealing layer, which fills the vias.

In another manifestation, a method for filling vias formed in a dielectric layer with a metal or metal alloy that has a low solubility with copper over copper containing interconnects, wherein the vias are part of a dual damascene structure with trenches and vias, is provided. A layer of a first metal or metal alloy that has a low solubility with copper is electrolessly deposited on the copper containing interconnect to form a layer on the copper containing interconnect. The electrolessly deposited layer is rinsed and dried. A via fill of a second metal or metal alloy that has a low solubility with copper over is electrolessly deposited on the layer, which fills the vias. The via fill comprises performing an electroless deposition of the second metal or metal alloy that has a low solubility with copper, wherein the electroless deposition of the via fill uses an electroless deposition bath that is more reactive than an electroless deposition bath that is used for electrolessly depositing the layer. An acid clean can be provided to remove metallic contamination.

In another manifestation, a method for filling vias formed in a dielectric layer with a metal or metal alloy that has a low solubility with copper over copper containing interconnects, wherein the vias are part of a dual damascene structure with trenches and vias, is provided. A chemical vapor deposition (CVD) of a layer of a first (sealing) metal or metal alloy that has a low solubility with copper is deposited over the copper containing interconnects. A via fill of a second metal or metal alloy that has a low solubility with copper over the layer is electrolessly deposited, which fills the vias. The via fill comprises performing an electroless deposition of the second metal or metal alloy that has a low solubility with copper and optionally providing an acid clean to remove metallic contamination.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
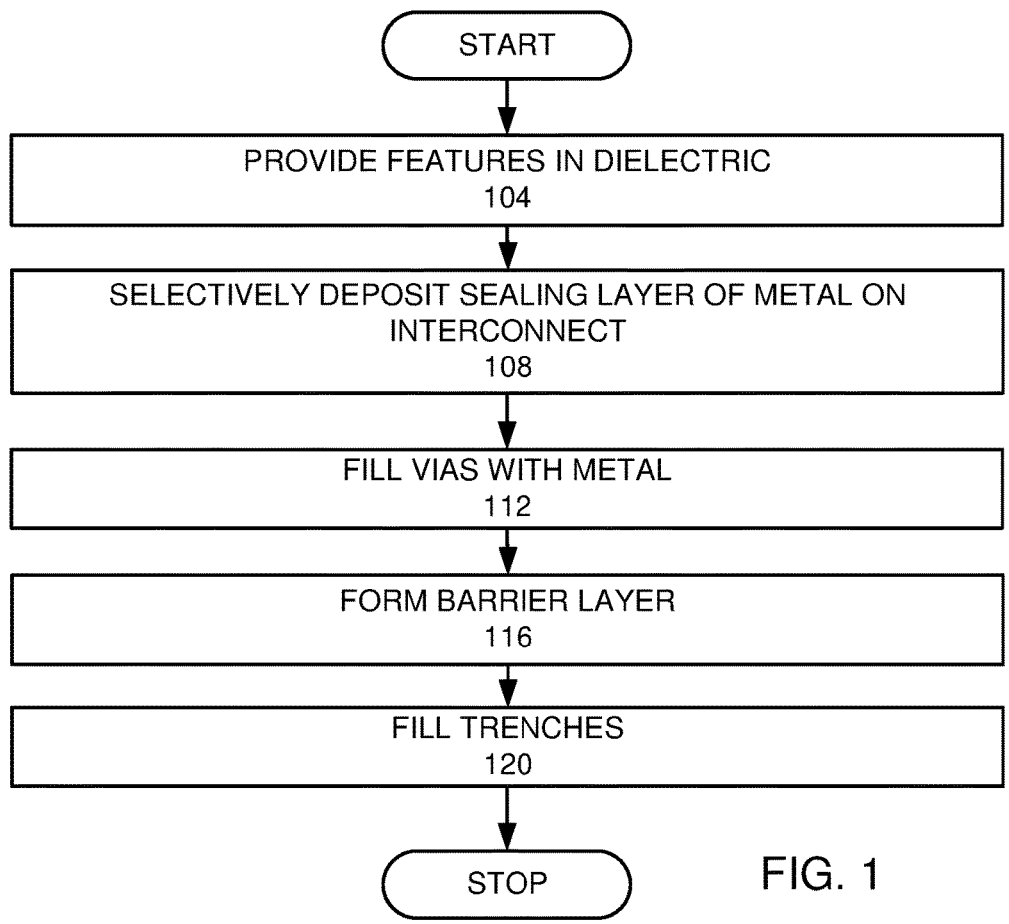
FIG. 1 is a flow chart of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. For instance, the invention is not restricted to how the vias and trenches are formed. In the description, mostly dual damascene case is highlighted but invention can be applied to vias formed in single damascene process.

In the formation of semiconductor devices, features are formed in a dielectric layer. The features may be in the form of vias and trenches. Vias may pass through a dielectric layer to interconnects below. Trenches pass only partially through the dielectric layer and provide conductive connections between features at the same metal level while vias providing connection between trenches at different metal levels.

In many applications, selective electroless deposition is performed on substrates which are electrochemically more noble than the metal that is deposited on the substrate. These substrates are generally covered with a metal oxide film that needs to be removed before electroless deposition. Upon the oxide removal or in general the cleaning process, metal ions from the substrate get into the deposition solution or adsorb on other non-metal part of the wafer surface. These metal ions released into the deposition solution can cause nanoparticle formation in the plating solution which leads to increased particle formation on the semiconductor substrate, thereby increasing defectivity and lowering electrical yield. This is especially the problem when highly reactive deposition chemistry needs to be used to plate even the most isolated features on the surface.

In a specific case, electroless Co deposition on a mixed surface with exposed Cu often causes selectivity loss. This is due to the fact that during the cleaning process of Cu, Cu ions, both Cu(I) and Cu(II), are released into the solution. These ions upon rinsing the clean chemistry may be retained on the wafer surface and get into the deposition solution which is the subsequent step after cleaning in the plating process. Cu ions can go through several reactions with the plating solutions. Cu ions can interact with the reducing agent and form Cu nanoparticles in the plating solution or, in case of Cu(I) ions, they can disproportionate and form Cu nanoparticles. These Cu nanoparticles are catalytically active for Co plating. Depending on the surface type, these Co coated Cu particles will adhere to the surface creating Co nodules on the surface which is also known as selectivity loss if the particles adhere to non-catalytic surface (such as the dielectric portion of the wafer).

As the industry moves towards narrower features and thinner liner/seed/barrier, the advantages provided by electroless deposition are more attractive.

FIG. 1 is a high level flow chart of an embodiment of the invention. In this embodiment, features are formed in a dielectric layer (step 104). The features have vias that extend to interconnects. A sealing layer of a first metal or metal alloy that has a low solubility with copper is selectively deposited on the interconnects at bottoms of the vias (step 108). In the specification and claims the metal or metal alloy may be a pure metal or metal alloy. Having a low solubility with copper is defined as meaning that copper has a less than 1% (atomic percent) solubility with the metal or metal alloy. At such a low solubility, the metal or metal alloy is considered immiscible with copper. The thickness of this layer is 5 Å-100 Å and more preferably between 10 Å and 50 Å. This dry deposition is followed by an electroless plating to fill the vias with a second metal or metal alloy that has a low solubility with copper (step 112). In some embodiments, the first metal or metal alloy is the same as the second metal or metal alloy. In other embodiments, the first metal or metal alloy is different than the second metal or metal alloy. A barrier layer is formed over the filled vias (step 116). Trenches are filled with a conductive metal or metal alloy such as copper (step 120).

Figure 2A:
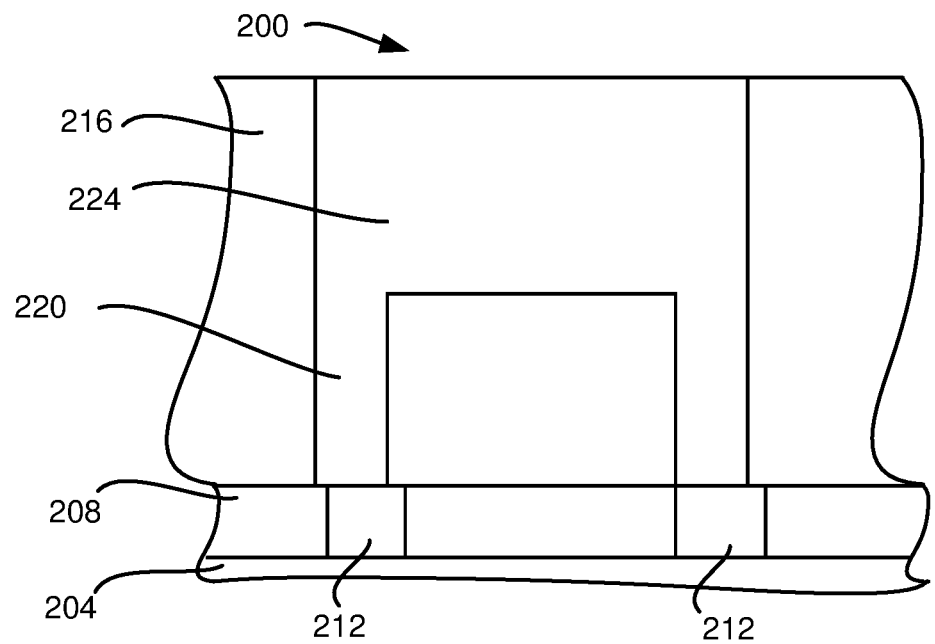
FIGS. 2A-F are schematic views of the formation of structures using the inventive process.

In a preferred embodiment of the invention, features are formed in a dielectric layer (step 104). FIG. 2A is a schematic cross-sectional view of a stack 200 with a substrate 204 with a first dielectric layer 208 with conductive interconnects 212 formed in the first dielectric layer 208. A second dielectric layer 216 is formed over the first dielectric layer 208 with features, which comprise at least one via 220 and at least one trench 224. The feature forms a dual damascene structure with trenches and vias. In this example, one or more layers 216 may be disposed between the substrate 204 and the first dielectric layer 208. In this embodiment, the second dielectric layer 216 is a dense low-k dielectric material In this embodiment the conductive interconnects 212 are copper. Although this example provides a simplified view of a dual damascene structure using selective via fill. In other embodiments, the dielectric layer is made up of several different dielectrics which are but not limited to etch stop layer(s), inter level dielectric, ARC layer, and even a hard mask if needed.

A sealing layer of a first metal or metal alloy that has a low solubility with copper is selectively deposited on the interconnects at bottoms of the vias (step 108). The selective deposition only deposits on catalytically active material, so that the layer is only deposited on the interconnects at the bottoms of the vias. In one embodiment, the selective deposition is accomplished by first cleaning the features. The copper cleaning can be achieved by plasma treatment, by solvent cleaning or by wet cleaning which may or may not contain solvent. Wet cleaning chemistry is generally acidic in nature and contains carboxylic/hydroxycarboxylic acid(s). The Cu ions generated in this wet clean process are not active for the subsequent dry (non-aqueous) deposition process that forms the sealing layer, hence no Co particle formation is expected. If the copper ions are not removed, and subjected to a reactive electroless bath to deposit the first metal or metal alloy that has a low solubility to copper, the copper ions tend to be more reactive and would be reduced, contaminating the features with copper metal and cause selectivity loss during the selective deposition of the dry metal or metal alloy layer.

Electroless deposition is then used to selectively deposit metal or metal alloy that has a low solubility with copper on the sealing layer. Preferably, the metal or metal alloy that has a low solubility with copper is one or more of cobalt, ruthenium, or iridium or its alloys with other elements such as but not restricted to W, Mo, Re, P, and B. In this example, the deposited metal or metal alloy is pure cobalt, which has a solubility with copper of about 0.8%. Preferably, the electroless metal or metal alloy plating bath provides an initially pure metal or metal combination that has a low solubility with copper Examples of recipes for depositing cobalt are described in X. C. Wu, A. M. Bittner, and K. Kern, Spatially Selective Electroless Deposition of Cobalt on Oxide Surfaces Directed by Microcontact Printing of Dendrimers, *Langmuir* 2002, 18, 4984-4988, I. Stankevičienė, A. Jagminienė, L. Tamašauskaitė-Tamašiūnaitė, E. Norkus, Electroless Co—B Deposition Using Dimethylamine Borane as Reducing Agent in the Presence of Different Amines, *ECS Transactions* 2015, 64 (30), 17-24, and F. Pearlstein and R. F. Weightman, Electroless Cobalt Deposition from Acid Baths *J. Electrochem. Soc.* 1974, 121(8), 1023-1028, which are incorporated by reference for all purposes. In another example, the electroless deposition bath has a low reactivity to copper, to reduce the interaction of deposition solution with dissolved copper from the conductive interconnect 212. The deposition selectively deposits on the copper interconnects, as the dielectric sidewalls are not catalytically active, which thus provides a different result than a conformal deposition, which deposits on sidewalls. A post deposition clean may then be provided. An example of a post deposition clean would be an acid clean used to remove any metal contamination and nucleation centers from the exposed surface. The post deposition clean is less reactive than the pre-deposition clean, so that the deposited layer is not damaged.

Figure 2B:
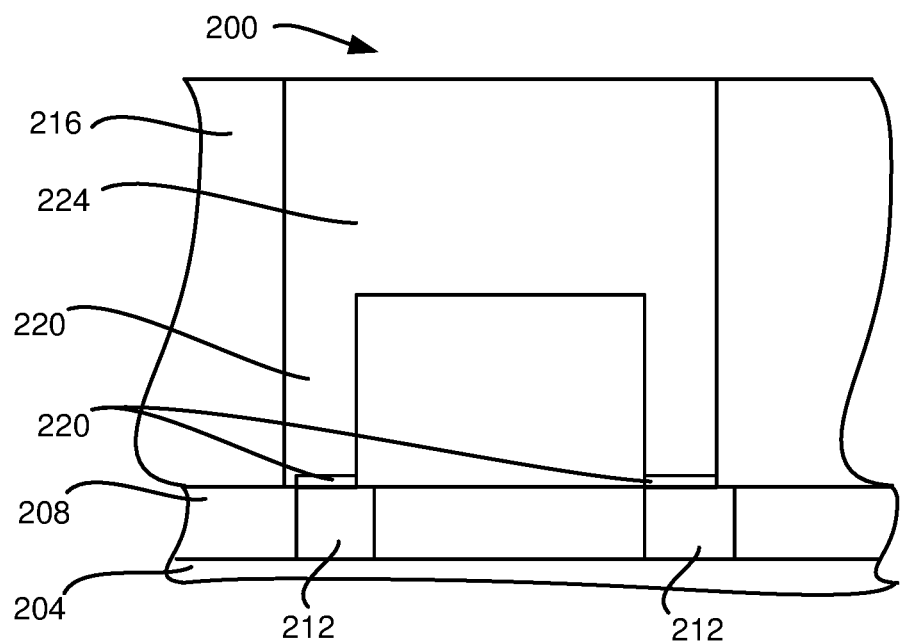

The layer is then rinsed and dried. The rinsing and drying can be done by any commonly used modules on semiconductor wet processing tools that is designed for this purpose. FIG. 2B is a schematic cross-sectional view of a stack 200 after the sealing layer of cobalt 228 has been selectively deposited.

Figure 2C:
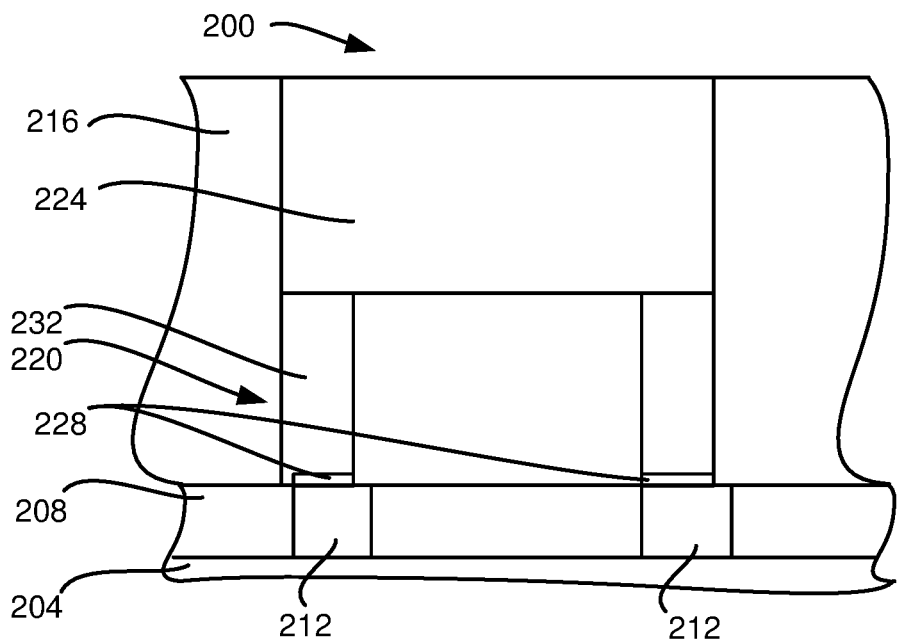

The vias are filled with a second metal or metal alloy that has a low solubility with copper using electroless deposition (step 112). Preferably, the second metal or metal alloy that has a low solubility with copper is one or more of cobalt, ruthenium, or iridium or its alloys with other elements such as but not restricted to W, Mo, Re, P, and B. In this example, the deposited second metal or metal alloy is pure cobalt. Preferably, the electroless bath has a higher reactivity than the electroless bath used to selectively deposit the layer over the interconnect. A higher reactivity is now allowable, since the copper interconnect has been sealed off by the first metal/metal alloy layer and is desirable to provide a faster deposition to fill the vias. The higher reactivity can be achieved many ways and it should be evident for those skilled in the art. Some examples are increasing deposition temperature, higher reducing agent concentration, more reactive reducing agent, using weaker complexing agent, using lower concentration of complexing agent, changing deposition solution pH. Again these are examples and not meant to cover all the possibilities, which may be specific for a given plating formulation. FIG. 2C is a schematic cross-sectional view of a stack 200 after the vias have been filled with cobalt 232 (step 112).

Figure 2D:
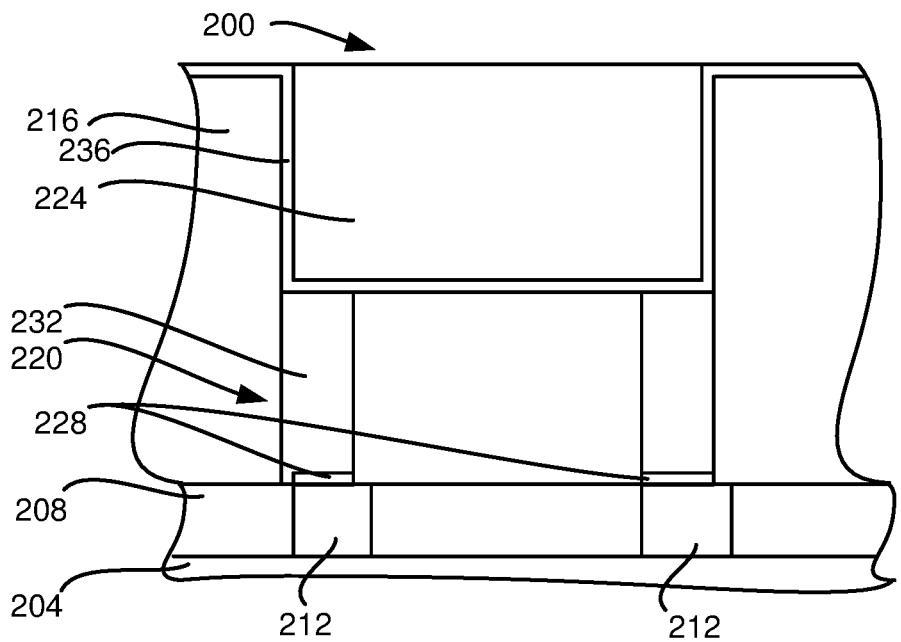

A barrier layer is formed over the filled vias (step 116). In this embodiment, the barrier layer comprises Ta, Ti, W or Mn containing barriers, such as but not limited to Ta, TaN, Ti, TiN, TiW, WN, WCN, Mn, MnOx, or MnN. In this example, the barrier layer is deposited using physical vapor deposition (PVD), chemical vapor deposition (CVD) or atomic layer deposition (ALD). FIG. 2D is a schematic cross-sectional view of a stack 200 after the barrier layer 236 has been deposited.

The barrier deposition is usually followed by a liner deposition. This is usually made up of Ta, Co or Ru containing films.

Figure 2E:
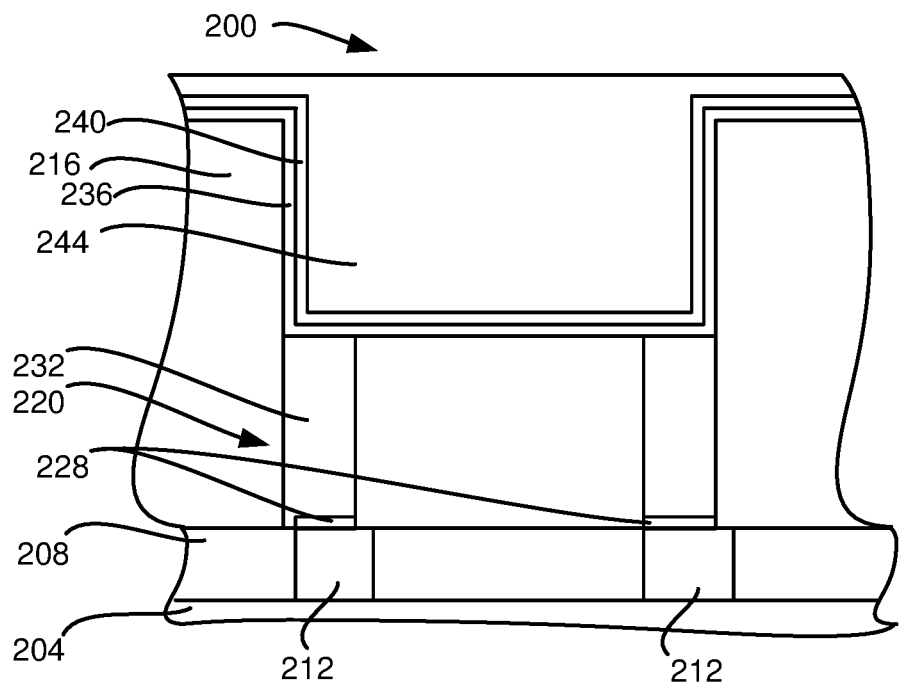

Generally but not necessarily, a seed layer is deposited before filling the trenches with a conductive metal. The seed layer is usually copper or a copper alloy, but in other embodiments may be of one or more of Co, Ni, Ru or W. The seed layer is deposited using physical vapor deposition. In other embodiments other techniques such as electroplating and electroless plating are also possible depending on the liner type and liner thickness. Chemical vapor deposition or atomic layer deposition of seed is also possible. The trenches are filled with a conductive metal or metal alloy, which is typically copper—(step 120). Various conventional processes may be used for filling the trenches with copper containing metal such as but not limited to electroplating, electroless plating, physical vapor deposition and chemical vapor deposition. FIG. 2E is a schematic cross-sectional view of a stack 200 after the seed layer 240 has been deposited and the trenches are filled with copper 244.

Figure 2F:
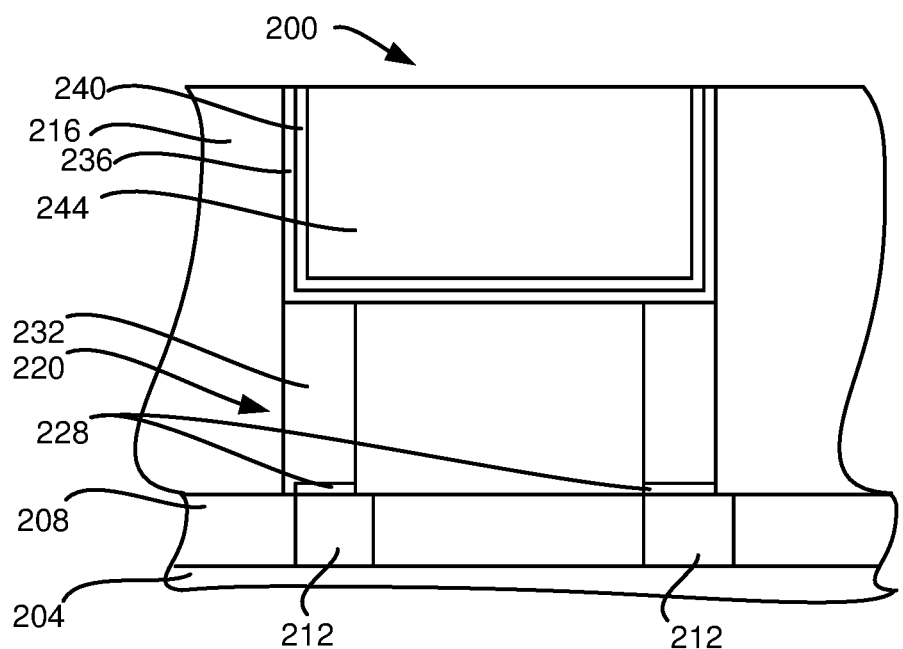

Other steps may be provided to further process the stack. For example, chemical mechanical polishing (CMP) may be used to planarize the stack. FIG. 2F is a schematic cross-sectional view of a stack 200 after the stack has been planarized.

In other embodiments, the selective deposition of the sealing layer on the interconnects may be accomplished using chemical vapor deposition (CVD) of the first metal or metal alloy that has a low solubility with copper. In another embodiment, a barrier layer may be provided after selectively depositing metal or metal alloy on the copper interconnect and before filling the vias.

It has been unexpectedly found that depositing the metal or metal alloy that has a low solubility with copper using the above embodiment reduced defects by ten times. Without being bound by theory, it is believed that the above embodiment reduces copper contamination from the copper interconnect, which reduces defects. More specifically, the copper surface is sealed off from the reactive deposition solution hence no injection of Cu ions into the reactive plating solution happen. Providing a first step of depositing a thin film with a low reactivity to copper reduces contamination from the copper interconnects. However, such processes have slower deposition rates and may not completely deposit in isolated regions. Once the copper interconnect is protected, a more reactive deposition process may be used to more quickly fill the vias with a metal or metal alloy that has a low solubility with copper and which will completely fill isolated regions. The subsequent cleaning after the selective depositing of the first metal or metal alloy that has a low solubility with copper on the copper interconnects is to further clean any copper contaminants that may have been left after the first deposition process. The drying of the sealing layer is provided to remove copper ion containing liquid from the vias that was left on the wafer surface after the deposition step.

Various embodiments seal the reactive surface with a less reactive but catalytically active metal or metal alloy before applying the reactive electroless plating solution on the substrate. Consequently, various embodiments are made up of two steps. The first step can be done by selective plating a first metal or metal alloy film on top of the reactive catalytic surface by CVD, ALD, or a low reactivity electroless deposition process. In the second step, a more reactive electroless plating solution is used. As no reactive metal ion can get into the deposition solution by the time the second step is applied the defectivity will be significantly lower. While the selective CVD and ALD deposition does not generate any Cu ions, the low reactivity Co plating is expected to still form some. In order to completely eliminate the Cu ion effect (which can be adsorbed on the surface) a post-clean step and a drying step that removes metallic contamination from dielectric may be needed to get the complete benefit of sealing the Cu surface. Preferably the sealing layer is formed from the same metal or metal alloy as the via fill. In some embodiments, the metal or metal alloy of the sealing layer may be different than the metal or metal alloy of the via fill.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for filling vias formed in a dielectric layer with a metal or metal alloy that has a low solubility with copper over copper containing interconnects, wherein the vias are part of an interconnect structure with trenches and vias, comprising:
   selectively depositing a sealing layer of a first metal that has a low solubility with copper or metal alloy that has a low solubility with copper directly on the copper containing interconnects at bottoms of the vias, wherein sidewalls of the dielectric layer forming the vias are exposed to the depositing the first metal or metal alloy, and wherein the first metal that has a low solubility with copper or metal alloy that has a low solubility is selectively deposited to only form a layer on the copper containing interconnects; and
   electrolessly depositing a via fill of a second metal that has a low solubility with copper or metal alloy that has a low solubility with copper over the sealing layer, which fills the vias.

2. The method, as recited in claim 1, wherein the electrolessly depositing the via fill comprises:
   providing a cleaning;
   performing an electroless deposition of the second metal that has a low solubility with copper or metal alloy that has a low solubility with copper; and
   providing an acid clean to remove metallic contamination.

3. The method, as recited in claim 2, wherein the selective depositing the sealing layer comprises a chemical vapor deposition (CVD) of the first metal that has a low solubility with copper or metal alloy that has a low solubility with copper.

4. The method, as recited in claim 3, wherein the first metal that has a low solubility with copper or metal alloy that has a low solubility with copper is one or more of cobalt, ruthenium, or iridium or its alloys with other elements such as but not restricted to W, Mo, Re, P, and B.

5. The method, as recited in claim 4, further comprising:
forming a barrier layer over the via fill and a trench adjacent to the via; and
filling the trench with a conductive metal or metal alloy containing at least one of copper, cobalt, ruthenium, nickel or tungsten.

6. The method, as recited in claim 2, wherein the selective depositing the sealing layer comprises:
providing a pre-deposition cleaning;
electrolessly depositing a layer of the first metal that has a low solubility with copper or metal alloy that has a low solubility with copper on the copper containing interconnects to form a layer on the copper containing interconnects, wherein the electroless deposition of the via fill uses an electroless deposition bath that is more reactive than an electroless deposition bath that is used for electrolessly depositing the sealing layer;
providing a post-deposition cleaning; and
rinsing and drying the electrolessly deposited layer.

7. The method, as recited in claim 6, wherein the first metal that has a low solubility with copper or metal alloy that has a low solubility with copper is one or more of cobalt, ruthenium, or iridium or its alloys with other elements such as but not restricted to W, Mo, Re, P, and B.

8. The method, as recited in claim 7, further comprising:
forming a barrier layer over the via fill and a trench adjacent to the via; and
filling the trench with a conductive metal or metal alloy containing at least one of copper, cobalt, ruthenium, nickel or tungsten.

9. The method, as recited in claim 2, wherein the depositing the sealing layer comprises: electrolessly depositing a layer of the first metal that has a low solubility with copper or metal alloy that has a low solubility with copper on the copper containing interconnects to form a layer on the copper containing interconnects, wherein the electroless deposition of the via fill uses an electroless deposition bath that is more reactive to copper than an electroless deposition bath that is used for electrolessly depositing the layer; and
rinsing and drying the electrolessly deposited layer.

10. The method, as recited in claim 9, wherein the first metal that has a low solubility with copper or metal alloy that has a low solubility with copper is one or more of cobalt, ruthenium, or iridium or its alloys with other elements such as but not restricted to W, Mo, Re, P, and B.

11. The method, as recited in claim 10, further comprising:
forming a barrier layer over the via fill and a trench adjacent to the via; and
filling the trench with a conductive metal or metal alloy containing at least one of copper, cobalt, ruthenium, nickel or tungsten.

12. The method, as recited in claim 1, wherein the first metal that has a low solubility with copper or metal alloy that has a low solubility with copper is one or more of cobalt, ruthenium, or iridium or its alloys with other elements such as but not restricted to W, Mo, Re, P, and B.

13. The method, as recited in claim 1, further comprising:
forming a barrier layer over the via fill and a trench adjacent to the via; and
filling the trench with a conductive metal or metal alloy containing at least one of copper, cobalt, ruthenium, nickel or tungsten.

14. The method, as recited in claim 1, wherein the sealing layer has a thickness of between 5 Å-100 Å.

15. A method for filling vias formed in a dielectric layer with a metal or metal alloy that has a low solubility with copper over copper containing interconnects, wherein the vias are part of an interconnect structure with trenches and vias, comprising:
electrolessly depositing a layer of a first metal or metal alloy that has a low solubility with copper on the copper containing interconnects to form a layer on the copper containing interconnects;
drying the electrolessly deposited layer; and
electrolessly depositing a via fill of a second metal or metal alloy that has a low solubility with copper over the layer, which fills the vias; comprising:
performing an electroless deposition of the second metal or metal alloy that has a low solubility with copper, wherein the electroless deposition of the via fill uses an electroless deposition bath that is more reactive than an electroless deposition bath that is used for electrolessly depositing the layer; and
providing an acid clean to remove metallic contamination.

16. The method, as recited in claim 15, wherein the first metal or metal alloy that has a low solubility with copper is one or more of cobalt, ruthenium, or iridium or its alloys with other elements such as but not restricted to W, Mo, Re, P, and B.

17. The method, as recited in claim 16, further comprising:
forming a barrier layer over the via fill and a trench adjacent to the via; and
filling the trench with a conductive metal or metal alloy containing at least one of copper, cobalt, ruthenium, nickel or tungsten.

18. A method for filling vias formed in a dielectric layer with a metal or metal alloy that has a low solubility with copper over copper containing interconnects, wherein the vias are part of an interconnect structure with trenches and vias, comprising:
depositing a chemical vapor deposition (CVD) of a layer of a first metal or metal alloy that has a low solubility with copper on the copper containing interconnects; and
electrolessly depositing a via fill of a second metal or metal alloy that has a low solubility with copper over the layer, which fills the vias; comprising:
performing an electroless deposition of the second metal or metal alloy that has a low solubility with copper; and
providing an acid clean to remove metallic contamination.

19. The method, as recited in claim 18, wherein the first metal or metal alloy that has a low solubility with copper is one or more of cobalt, ruthenium, or iridium or its alloys with other elements such as but not restricted to W, Mo, Re, P, and B.

20. The method, as recited in claim 19, further comprising:
forming a barrier layer over the via fill and a trench adjacent to the via; and
filling the trench with a conductive metal or metal alloy containing at least one of copper, cobalt, ruthenium, nickel or tungsten.

* * * * *